(12) United States Patent
Inoue et al.

(10) Patent No.: US 6,211,509 B1
(45) Date of Patent: Apr. 3, 2001

(54) SOLID-STATE IMAGE SENSOR

(75) Inventors: Ikuko Inoue, Kawasaki; Nobuo Nakamura, Yokohama, both of (JP); Hirofumi Yamashita, Cambridge, MA (US); Tetsuya Yamaguchi, Yokohama (JP); Hidetoshi Nozaki, Yokohama (JP); Hisanori Ihara, Yokohama (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

(21) Appl. No.: 09/280,722

(22) Filed: Mar. 30, 1999

(30) Foreign Application Priority Data

Mar. 31, 1998 (JP) .................................... 10-087385

(51) Int. Cl.$^7$ ............................. H01L 27/00; H04N 3/14; H04N 5/225; G02B 13/16
(52) U.S. Cl. ...................... 250/208.1; 348/302; 348/294; 348/308; 348/335; 348/340
(58) Field of Search ........................ 250/208.1; 348/241, 348/248, 250, 294, 297, 300, 301, 302, 307, 308, 310, 335, 340; 251/445, 446, 230, 292

(56) References Cited

U.S. PATENT DOCUMENTS 4,677,453 * 6/1987 Matsumoto et al. ................ 257/291
6,091,449 * 7/2000 Matsunaga et al. ................ 348/308

* cited by examiner

*Primary Examiner*—Georgia Epps
*Assistant Examiner*—David N. Spector
(74) *Attorney, Agent, or Firm*—Oblon, Spivak, McClelland, Maier & Neustadt, P.C.

(57) ABSTRACT

A MOS-type solid-state image sensor has a plurality of pixel units arranged on a p-type Si substrate in a matrix format. Each pixel unit has a photoelectric conversion portion including a photodiode, and a signal extraction portion including an amplification MOS transistor. Each element isolation region for isolating the pixel units from each other has a field oxide film formed on the substrate and a p-type diffusion layer formed in the substrate layer immediately below the oxide film to have a higher carrier impurity concentration than the substrate layer. The bottom portion of each element isolation region is positioned deeper than the bottom portion of a depletion layer extending from the p-n junction of the photodiode to the substrate in an equilibrium state.

24 Claims, 5 Drawing Sheets

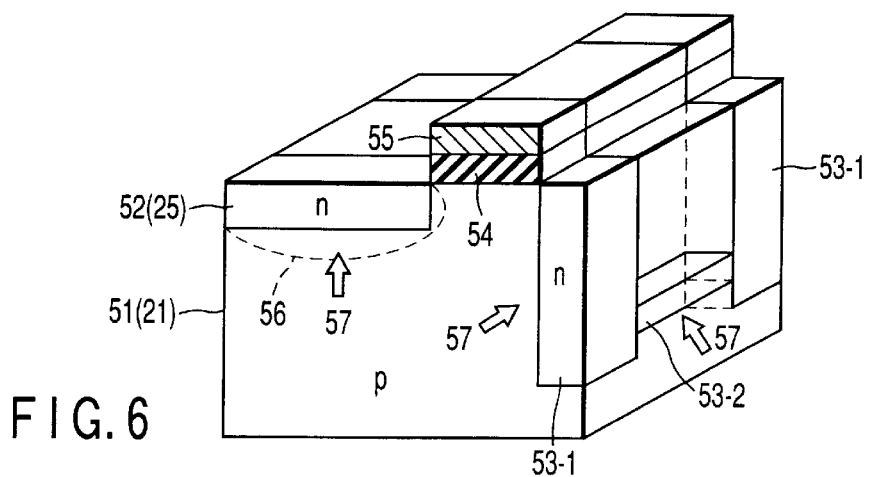
FIG. 6
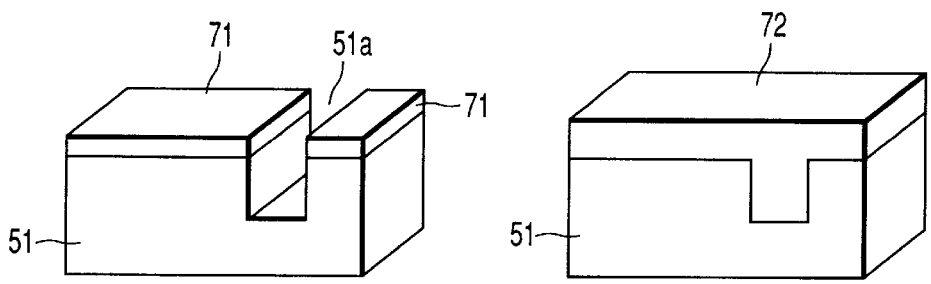
FIG. 7A
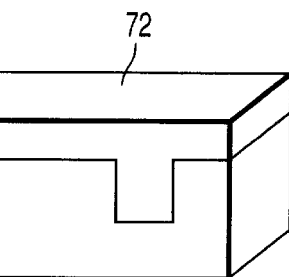
FIG. 7B
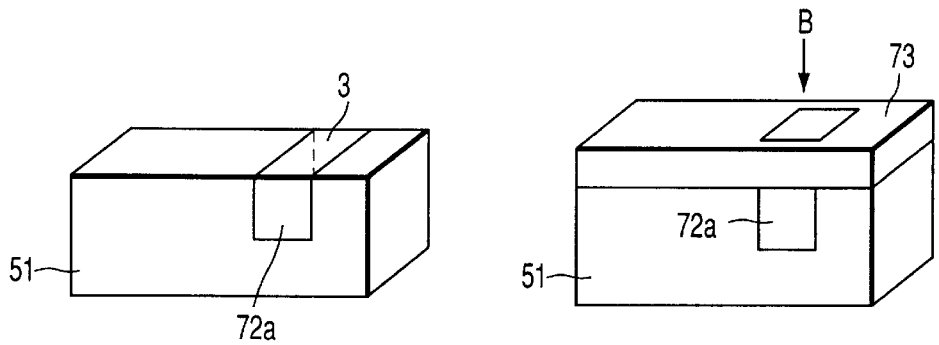
FIG. 7C
FIG. 7D
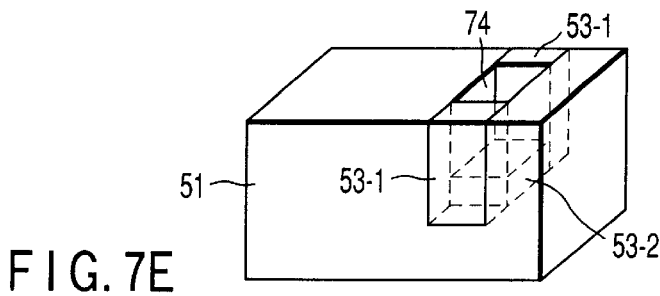
FIG. 7E

SOLID-STATE IMAGE SENSOR

BACKGROUND OF THE INVENTION

The present invention relates to a solid-state image sensor and, more particularly, to a MOS-type solid-state image sensor including pixel units each having a signal amplification function.

MOS-type solid-state image sensors have recently received a great deal of attention because of the following advantages. A MOS-type solid-state image sensor allows a reduction in size, can be driven by a single power supply, and allows all components such as an image sensing section and peripheral circuits to be integrated into one integrated circuit chip by a MOS process.

The MOS-type solid-state image sensor suffers the problem of leakage of electrons into adjacent pixel units upon incidence of long-wavelength light and the problem of expansion of the depletion layer of a photodiode with a reduction in pixel unit size. These problems will be described below.

Leakage of Electrons into Adjacent Pixel Unit upon Incidence of Long-wavelength Light FIG. 4 is a schematic sectional view of a structure of a conventional MOS-type solid-state image sensor which corresponds to two pixel units.

As shown in FIG. 4, this solid-state image sensor is formed by using a p-type Si substrate 41 on which pixel units arranged in a matrix format, a signal scanning circuit, and the like are formed. Each pixel unit includes a photoelectric conversion portion 42 for photoelectrically converting image-sensing light and an amplification transistor 43 for extracting a signal obtained by the photoelectric conversion portion 42.

The photoelectric conversion portion 42 has an n-type diffusion layer 45 which forms a photodiode together with the p-type substrate 41. The photoelectric conversion portion 42 also has an n-type diffusion layer 91. A signal read gate electrode 46 is formed between the diffusion layers 45 and 91 through a gate insulating film.

The amplification transistor 43 includes a pair of n-type diffusion layers 93 and 95 and a gate electrode 94 formed between the n-type diffusion layers 93 and 95 through a gate insulating film. The gate electrode 94 is connected to the signal read gate electrode 46 though an interconnection 92. The diffusion layer 95 is connected to a vertical signal line 47.

On the resultant structure, a light-shielding film 48 and a focusing lens 49 are formed through an insulating film 96. The focusing lens 49 is a microlens formed in each cell to form an optical image on the photodiode 45 of a corresponding cell. A light-shielding film 48 is formed to optically isolate adjacent cells.

In addition, on the p-type substrate 41, a field oxide film 44a, 44b, i.e., a silicon oxide film as an insulator, is formed. The film serves as part of each element isolation region. The portion 44a of the field oxide film surrounds each pixel unit to isolate the pixel units from each other. The portion 44b of the field oxide film extends in each pixel unit to isolate the photoelectric conversion portion 42 from the amplification transistor 43.

A shallow diffusion layer 44-1 serving as part of each element isolation region is formed under the field oxide film 44a, 44b. The diffusion layer 44-1 is a p-type layer having a higher carrier impurity concentration (lower resistance) than the substrate 41.

The following problem is posed in the structure shown in FIG. 4.

Long-wavelength light, e.g., red light, incident on the substrate 41 enters a deep portion of the silicon substrate 41. The light is then photoelectrically converted into electrons corresponding to electron/photon energy in the deep portion. The signals (electrons) generated in the deep portion of the substrate move within the substrate, and many of the signals become image signals in the corresponding pixel units, but some of them leak and diffuse into adjacent pixel units. In a color image sensor, since object light must be decomposed into R (red), G (green), and B (blue) light components when received, pixel units are arranged as R, G, and B pixel units. Since these pixel units are arranged to be adjacent to each other, leakage/diffusion of signals into adjacent pixel units causes color mixture and blooming.

Expansion of Depletion Layer of Photodiode with Reduction in Pixel Unit Size The apparatus shown in FIG. 4 is a MOS-type solid-state image sensor including pixel units each having a signal amplification function. The MOS-type solid-state image sensor having the amplification function can cope with an increase in the number of pixel units and is suitable for a reduction in pixel unit size due to a reduction in image size.

This solid-state image sensor has a structure in which a photodiode of a photoelectric conversion portion and an amplification transistor are arranged side by side in each pixel unit on a single substrate. The potential of a signal charge storage portion is modulated with a signal charge generated by photoelectric conversion in the photoelectric conversion portion, and the amplification transistor in each pixel unit is modulated with the potential. With this operation, an amplification function is imparted to each pixel unit.

In the MOS-type solid-state image sensor having the amplification function, however, with an increase in the number of pixel units, the area of the photoelectric portion of each pixel unit decreases. As a result, the output from each photoelectric conversion portion reduces.

To solve this problem of the reduction in photodetection output (image signal output), the carrier impurity concentration of the semiconductor substrate may be decreased to expand the depletion layer of the photodiode of each photoelectric conversion portion. The decrease in the impurity concentration of the semiconductor substrate increases the diffusion current in the substrate.

In the MOS-type solid-state image sensor in FIG. 4, each photodiode is made up of a lightly doped p-type semiconductor substrate and an n-type semiconductor layer formed in the substrate. In this case, the amount of leakage current in each photodiode during a dark period increases depending on the depth at which the depletion layer of the photodiode extends in the semiconductor substrate. As a result, the dynamic range decreases.

In addition, when a pixel unit is irradiated with strong light to generate a large amount of carriers (electrons), especially when the amount of carriers generated exceeds the capacity of the photodiode, the carriers overflow the photodiode. In this case, the carriers leak into the photodiodes of the adjacent pixel units, resulting in considerable deterioration in image quality (blooming).

BRIEF SUMMARY OF THE INVENTION

It is an object of the present invention to provide a MOS-type solid-state image sensor which can reduce the frequency of the occurrence of color mixture and blooming which are caused by leaking signals generated in a deep portion of a semiconductor substrate owing to the penetration of long-wavelength light.

is another object of the present invention to provide a MOS-type solid-state image sensor which can reduce the influences of diffusion currents from a semiconductor substrate where each pixel unit is reduced in size and the carrier impurity concentration of the semiconductor substrate is decreased. With this sensor, leakage current in each photodiode during a dark period can be reduced, and the dynamic range can be increased. In addition, blooming and color mixture can be suppressed.

According to a first aspect of the present invention, there is provided a solid-state image sensor comprising:

a plurality of pixel units arranged on a semiconductor substrate layer of a first conductivity type in a matrix format, each of the pixel units having a photoelectric conversion portion for photoelectrically converting image-sensing light and a signal extraction portion including a field-effect transistor for extracting a signal from the photoelectric conversion portion;

a scanning circuit connected to the signal extraction portions to sequentially read and transfer the signals obtained by the photoelectric portions of the plurality of pixel units; and element isolation regions for isolating the pixel units from each other, each pixel element isolation region having a bottom portion positioned deeper than a bottom portion of a depletion layer extending from the photoelectric conversion portion to the substrate layer in an equilibrium state.

According to a second aspect of the present invention, there is provided a solid-state image sensor comprising:

a plurality of pixel units arranged on a semiconductor substrate layer having a first conductivity type in a matrix format, each of the pixel units having a photoelectric conversion portion including a photodiode which forms a p-n junction for photoelectrically converting image-sensing light and a signal extraction portion including a MOS transistor for extracting a signal obtained by the photodiode;

a scanning circuit connected to the signal extraction portions to sequentially read and transfer the signals obtained by the photoelectric portions of the plurality of pixel units; and element isolation regions for isolating the pixel units from each other, each pixel element isolation region having a bottom portion positioned deeper than a bottom portion of a depletion layer extending from the p-n junction to the substrate layer in an equilibrium state.

According to a third aspect of the present invention, there is provided a solid-state image sensor comprising:

a plurality of pixel units arranged on a semiconductor substrate layer having a first conductivity type in a matrix format, each of the pixel units having a photodiode which forms a p-n junction for photoelectrically converting image-sensing light, an amplification transistor comprising a MOS transistor for extracting a signal obtained by the photodiode, a selection transistor comprising a MOS transistor for selecting the pixel unit, and a reset transistor comprising a MOS transistor for resetting a signal charge in the photodiode;

a scanning circuit arranged to sequentially read and transfer the signals obtained by the photoelectric conversion portions of the plurality of pixel units, the scanning circuit including a plurality of signal lines connected to the amplification transistors to transfer the signals from the pixel units, a plurality of address lines connected to the selection transistors to select the pixel units, a plurality of reset lines connected to the reset transistors to selectively reset the pixel units, and a driving circuit for driving the signal lines, the address lines, and the reset lines; and element isolation regions for isolating the pixel units from each other, the element isolation region having a bottom portion positioned deeper than a bottom portion of a depletion layer extending from the p-n junction to the substrate layer in an equilibrium state.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 6 is a perspective sectional view of a MOS-type solid-state image sensor according to still another embodiment of the present invention, showing a structure near photodiodes and reset transistors; and FIGS. 7A to 7E are perspective sectional views showing the steps in a method of manufacturing the sensor in FIG. 6.

DETAILED DESCRIPTION OF THE INVENTION

Figure 1A:
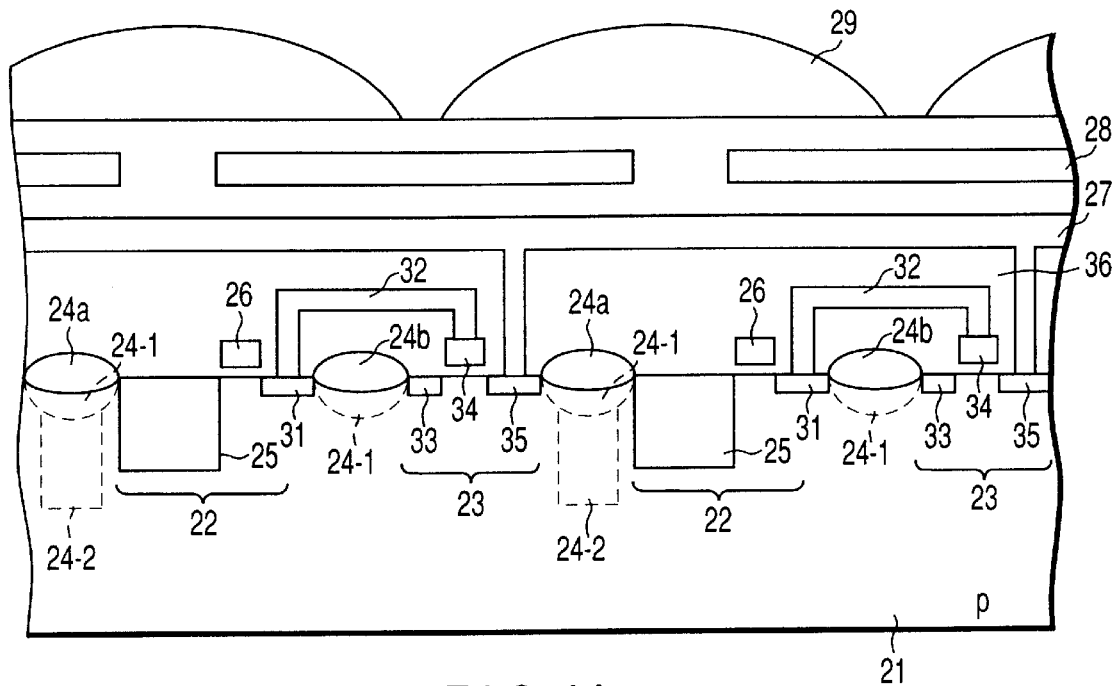
FIG. 1A is a schematic sectional view of a MOS-type solid-state image sensor according to an embodiment of the present invention, showing a structure near photodiodes and amplification transistors.

Embodiments of the present invention will be described below with reference to the views of the accompanying drawing. The same reference numerals denote constituent elements having similar functions and arrangements in the following description, and a repetitive description will be made only when required.

Figure 5:
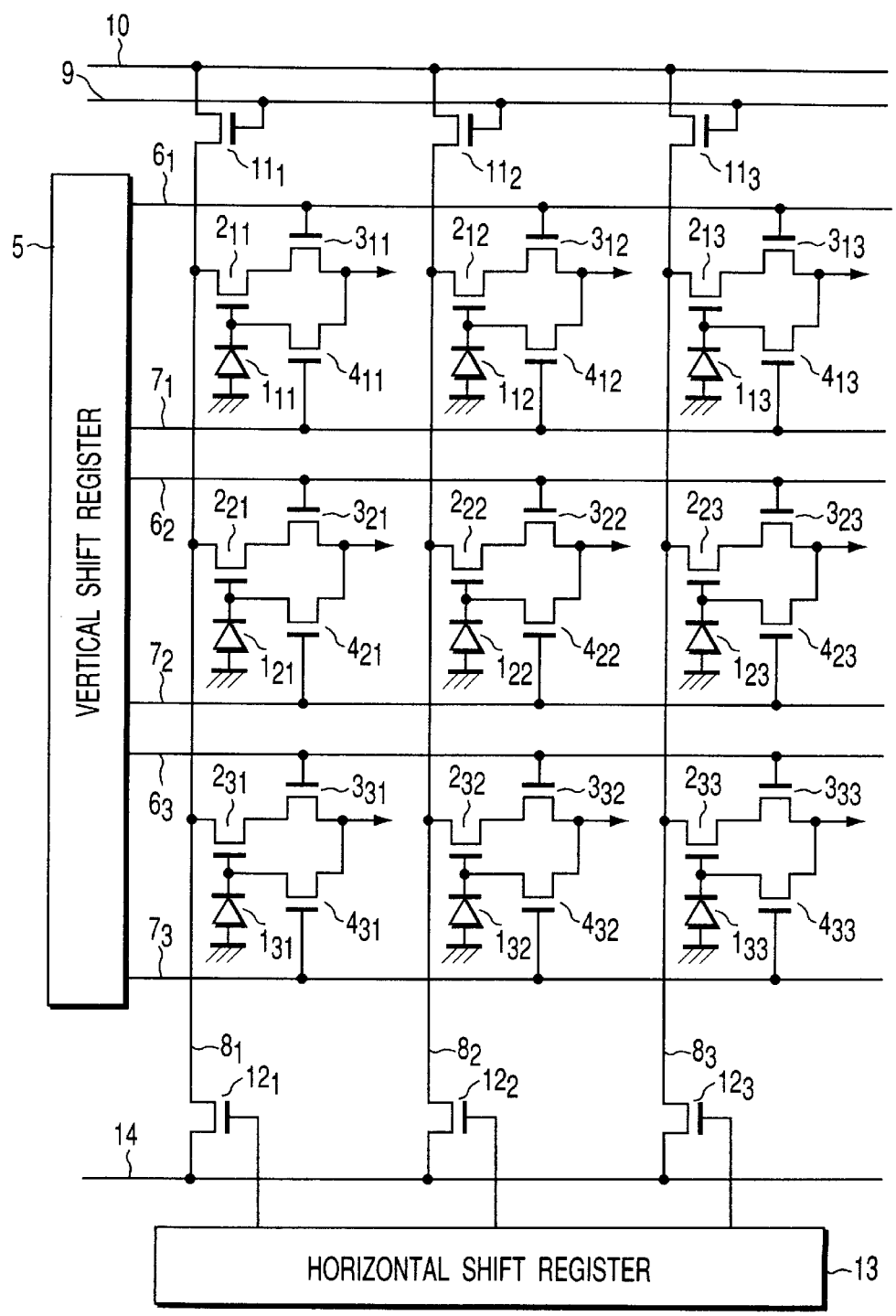
FIG. 5 is a circuit diagram showing a MOS-type solid-state image sensor having a signal amplification function.

FIG. 5 is a circuit diagram showing a MOS-type solid-state image sensor having a signal amplification function.

As shown in FIG. 5, the respective pixel units of the solid-state image sensor have photodiodes $1_{11}, 1_{12}, 1_{13}, \ldots, 1_{33}, \ldots$ for photoelectrically converting image-sensing light. The respective pixel units have amplification transistors $2_{11}, 2_{12}, 2_{13}, \ldots, 2_{33}, \ldots$ which are MOS transistors to amplify and extract signals from the photodiodes $1_{11}, 1_{12}, 1_{13}, \ldots, 1_{33}, \ldots$. In addition, the respective pixel units have vertical selection transistors $3_{11}, 3_{12}, 3_{13}, \ldots, 3_{33}, \ldots$ which are MOS transistors to select lines through which signals are read. The respective pixel units also have photodiodes $4_{11}, 4_{12}, 4_{13}, \ldots, 4_{33}, \ldots$ which are MOS transistors to reset the signal charges in the photodiodes $1_{11}, 1_{12}, 1_{13}, \ldots, 1_{33}, \ldots$. The pixel units formed of the combinations of these elements are arranged in a matrix format to form an image sensing section. Although FIG. 5 shows a 3×3 matrix of unit cells, an actual sensor has more unit cells in a matrix format.

Horizontal address lines $6_1, 6_2, 6_3, \ldots$ and reset lines $7_1, 7_2, 7_3, \ldots$ extend from a vertical shift register 5 in the horizontal direction. These lines are respectively connected to the unit cells described above. The horizontal address lines $6_1, 6_2, 6_3, \ldots$ are respectively connected to the gates of the vertical selection transistors $3_{11}, 3_{12}, 3_{13}, \ldots, 3_{33}, \ldots$ to determine lines through which signals are read. The reset lines $7_1, 7_2, 7_3, \ldots$ are respectively connected to the gates of the photodiodes $4_{11}, 4_{12}, 4_{13}, \ldots, 4_{33}, \ldots$.

The sources of the amplification transistors $2_{11}, 2_{12}, 2_{13}, \ldots, 2_{33}, \ldots$ are connected to vertical signal lines $8_1, 8_2, 8_3, \ldots$. Each of load transistors $11_1, 11_2, 11_3, \ldots$ connected to a common gate line 9 and a common source line 10 is connected to one end of a corresponding one of the vertical signal lines $8_1, 8_2, 8_3, \ldots$. Each of horizontal selection transistors $12_1, 12_2, 12_3, \ldots$ is connected to the other end of a corresponding one of the vertical signal lines $8_1, 8_2, 8_3, \ldots$. The horizontal selection transistors $12_1, 12_2, 12_3, \ldots$ are connected to a horizontal signal line 14 to be selected in accordance with a selection pulse supplied from a horizontal shift register 13.

Units of light incident on the respective pixel units are converted into electrical signals by the photodiodes $1_{11}, 1_{12}, 1_{13}, \ldots, 1_{33}, \ldots$ serving as photoelectric conversion portions. The electrical signals are sequentially read by a scanning circuit including the vertical selection transistors $3_{11}, 3_{12}, 3_{13}, \ldots, 3_{33}, \ldots$ and the horizontal selection transistors $12_1, 12_2, 12_3, \ldots$. The scanning circuit is driven/controlled by a driving circuit including the vertical shift register 5 and the horizontal shift register 13.

Figure 1B:
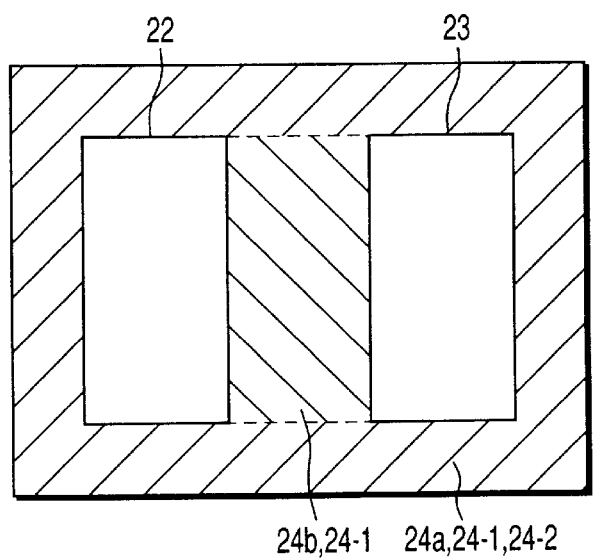
FIG. 1B is a schematic plan view showing the layout of a characteristic structure of the sensor in FIG. 1A.

FIG. 1A is a schematic sectional view of a MOS-type solid-state image sensor according to an embodiment of the present invention, showing a structure near photodiodes and amplification transistors, within two pixel units. FIG. 1B is a plan view schematically showing the layout of a characteristic structure of the sensor in FIG. 1A, within one pixel unit.

As shown in FIGS. 1A and 1B, this solid-state image sensor is formed by using a p-type Si substrate 21 (or well) on which pixel units arranged in a matrix format, a signal scanning circuit, and the like are mounted. Each pixel unit includes a photoelectric conversion portion 22 for photoelectrically converting image-sensing light and an amplification transistor 23 for extracting the signal obtained by the photoelectric conversion portion 22.

The photoelectric conversion portion 22 has an n-type diffusion layer 25 forming a photodiode, together with the p-type substrate 21. This photodiode corresponds to the photodiode $1_{11}$ (or $1_{12}, 1_{13}, \ldots, 1_{33}, \ldots$) in FIG. 5. The photoelectric conversion portion 22 also has an n-type diffusion layer 31. A signal read gate electrode 26 is formed between the diffusion layers 25 and 31 through a gate insulating film. The transistor of the photoelectric conversion portion 22 which is constituted by the gate electrode 26 and the like is not shown in FIG. 5.

The amplification transistor 23 corresponds to the amplification transistor $2_{11}$ (or $2_{12}, 2_{13}, \ldots, 2_{33}, \ldots$) in FIG. 5. The amplification transistor 23 has a pair of n-type diffusion layers 33 and 35 and a gate electrode 34 formed between the diffusion layers 33 and 35 through a gate insulating film. The gate electrode 34 is connected to the signal read gate electrode 26 through an interconnection 32. A vertical signal line 27 is connected to the diffusion layer 35.

A light-shielding film 28 and a focusing lens 29 are formed on the resultant structure through an insulating film 36. The focusing lens 29 is a microlens formed in each cell to form an optical image on the photodiode 25 of the cell. The light-shielding film 28 is formed to optically isolate the adjacent cells.

A field oxide film 24a, 24b, i.e., a silicon oxide film as an insulator, is also formed on the p-type substrate 21. The film serves as part of an element isolation region. A portion 24a of the field oxide film surrounds each pixel unit to isolate each pixel unit. A portion 24b of the field oxide film extends in each pixel unit to isolate the photoelectric conversion portion 22 from the amplification transistor 23.

A shallow first p-type diffusion layer 24-1 and a deep second p-type diffusion layer 24-2 serving as part of each element isolation region are formed under the portion 24a of the field oxide film that isolates the pixel units. only a shallow first diffusion layer 24-1 serving as part of each element isolation region is formed under the portion 24b of the field oxide film between the photoelectric conversion portion 22 and the amplification transistor 23. That is, in the sensor shown in FIGS. 1A and 1B, the element isolation regions are constituted by the field oxide film 24a, 24b and the first and second p-type diffusion layers 24-1 and 24-2.

The first diffusion layer 24-1 has a higher carrier impurity concentration (lower resistance) than the substrate 21. The second diffusion layer 24-2 has a carrier impurity concentration (in-between resistance) between the carrier impurity concentrations of the substrate 21 and first diffusion layer 24-1. The bottom portion of the second diffusion layer 24-2 is positioned deeper than the bottom portion of a depletion layer extending from the n-type diffusion layer 25 to the p-type substrate 21 in an equilibrium state where no voltage is applied.

More specifically, the first diffusion layer 24-1 is formed under the field oxide film 24a, 24b to have a depth of 0.5 $\mu$m or less. The second diffusion layer 24-2 is formed to have a depth of 0.5 $\mu$m or more and positioned deeper than the depletion layer.

According to the sensor shown in FIGS. 1A and 1B, since each element isolation region between the pixel units is formed by using the portion 24a of the field oxide film and the first and second diffusion layers 24-1 and 24-2, charges generated in a deep portion of the semiconductor substrate 21 by long-wavelength light entering a deep layer of the substrate can be confined in one pixel unit to prevent leakage of the charges into the adjacent pixel units. This can reduce color mixture and blooming which are caused by signals generated in a deep portion of the substrate and leaking from adjacent pixel units, and pose a problem in the prior art. Note that a deep second diffusion layer 24-2 may be formed under the portion 24b of the field oxide film between the photoelectric conversion portion 22 and the amplification transistor 23.

Figure 2A:
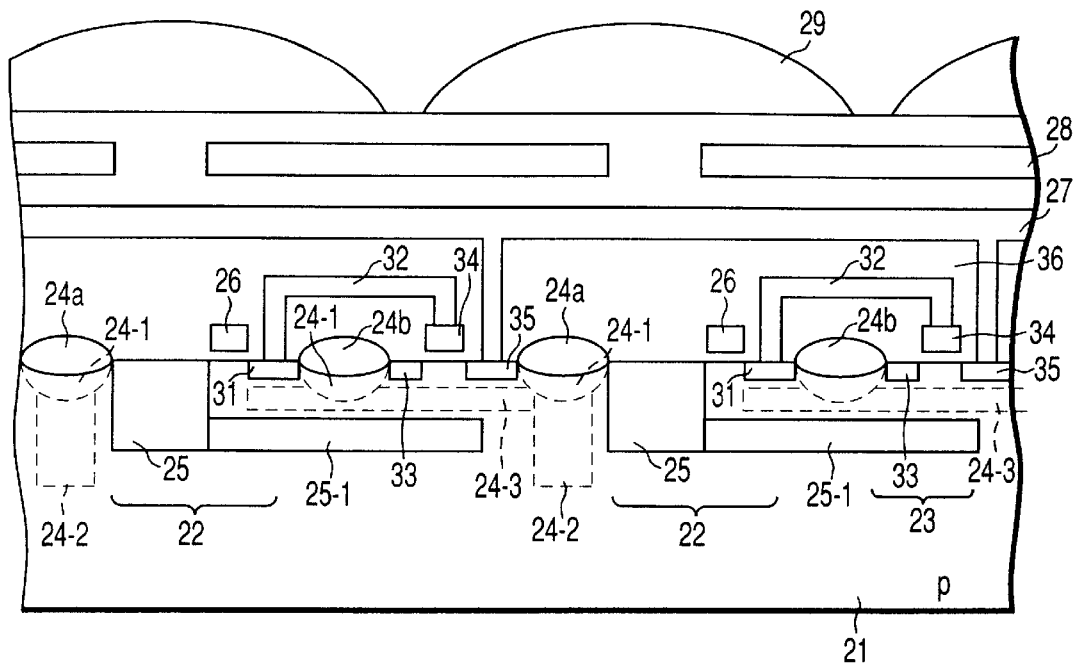
FIG. 2A is a schematic sectional view of a MOS-type solid-state image sensor according to another embodiment of the present invention, showing a structure near photodiodes and amplification transistors.
Figure 2B:
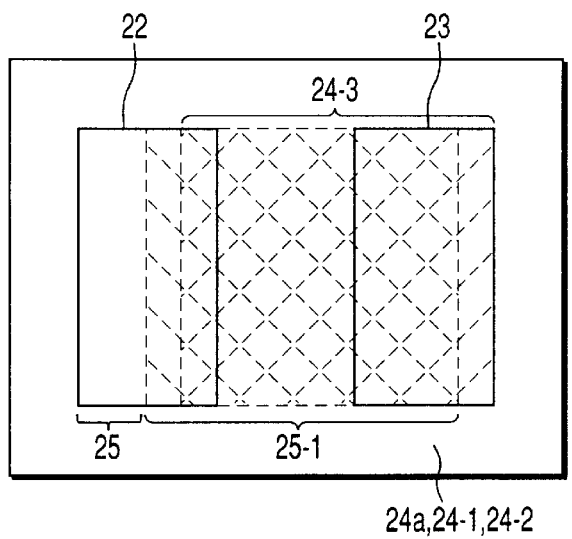
FIG. 2B is a schematic plan view showing the layout of a characteristic structure of the sensor in FIG. 2A.

FIG. 2A is a schematic sectional view of a MOS-type solid-state image sensor according to another embodiment of the present invention, showing a structure near photodiodes and amplification transistors, within two pixel units. FIG. 2B is a plan view schematically showing the layout of a characteristic structure of the sensor in FIG. 2A, within one pixel unit.

The sensor shown in FIGS. 2A and 2B is common to the sensor shown in FIGS. 1A and 1B in many respects. The sensor in FIGS. 2A and 2B differs from the sensor in FIGS. 1A and 1B in the following two points. First, a third p-type diffusion layer 24-3 is formed below a scanning circuit (an amplification transistor, a selection transistor, and a reset transistor), and an n-type diffusion layer 25-1 is formed below the third diffusion layer 24-3. The third diffusion layer 24-3 has a carrier impurity concentration between the carrier impurity concentrations of a substrate 21 and a first diffusion layer 24-1. The third diffusion layer 24-3 is connected to the first diffusion layer 24-1 and a second diffusion layer 24-2 and formed in a region at a depth of about 0.5 µm or more and a width of about 0.2 µm or more. The n-type diffusion layer 25-1 has a carrier impurity concentration almost the same as that of an n-type diffusion layer 25. The n-type diffusion layer 25-1 is connected to the n-type diffusion layer 25 of a photodiode and formed at some distance from the p-type diffusion layer 24-2.

According to the sensor in FIGS. 2A and 2B, the following effects can be obtained in addition to the effects of the sensor in FIGS. 1A and 1B. More specifically, since a signal generated in each pixel unit at a position deep in the semiconductor substrate is absorbed by the n-type diffusion layer 25-1 of each pixel unit, leakage signals into adjacent pixel units can be reduced. In a conventional structure, signals generated in regions other than the photodiodes, i.e., regions below the scanning circuit, are absorbed by the reset transistors and discarded. In contrast to this, according to the sensor in FIGS. 2A and 2B, since photodiodes are also formed below the scanning circuits, the saturation signal amount can be increased.

In each of the sensors shown in FIGS. 1A, 1B, 2A, and 2B, the diffusion layer of each element isolation region is made up of the shallow and deep diffusion layers 24-1 and 24-2. If, for example, third and fourth p-type diffusion layers are formed deeper below the deep diffusion layer 24-2, an element isolation effect can be obtained in a deeper portion of the substrate. This can more effectively reduce color mixture and blooming due to the leakage of signals between adjacent pixel units.

Figure 3:
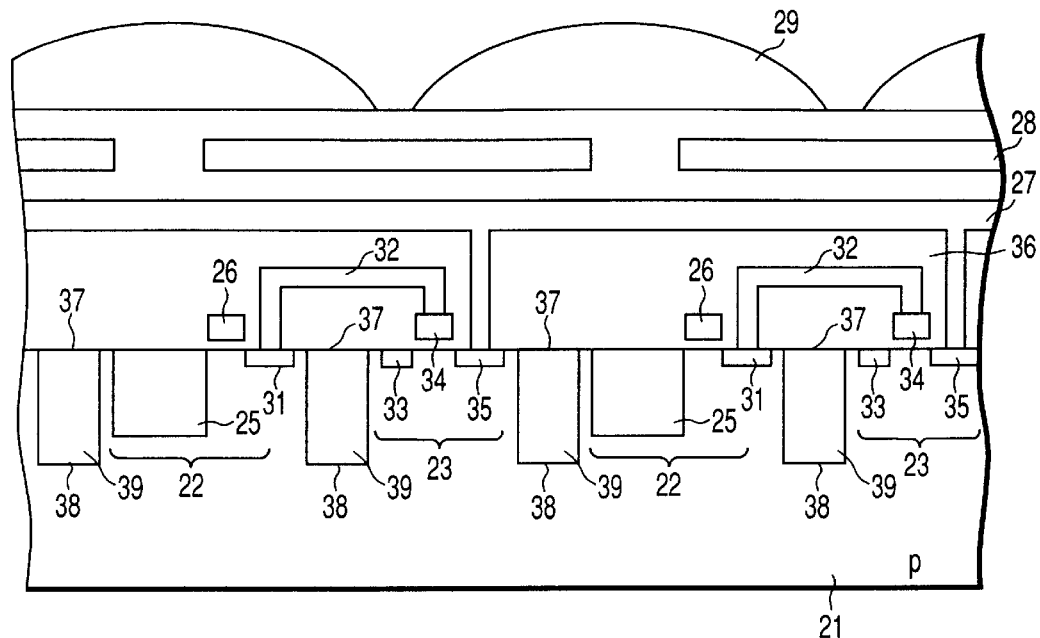
FIG. 3 is a schematic sectional view of a MOS-type solid-state image sensor according to still another embodiment of the present invention, showing a structure near photodiodes and amplification transistors.
Figure 4:
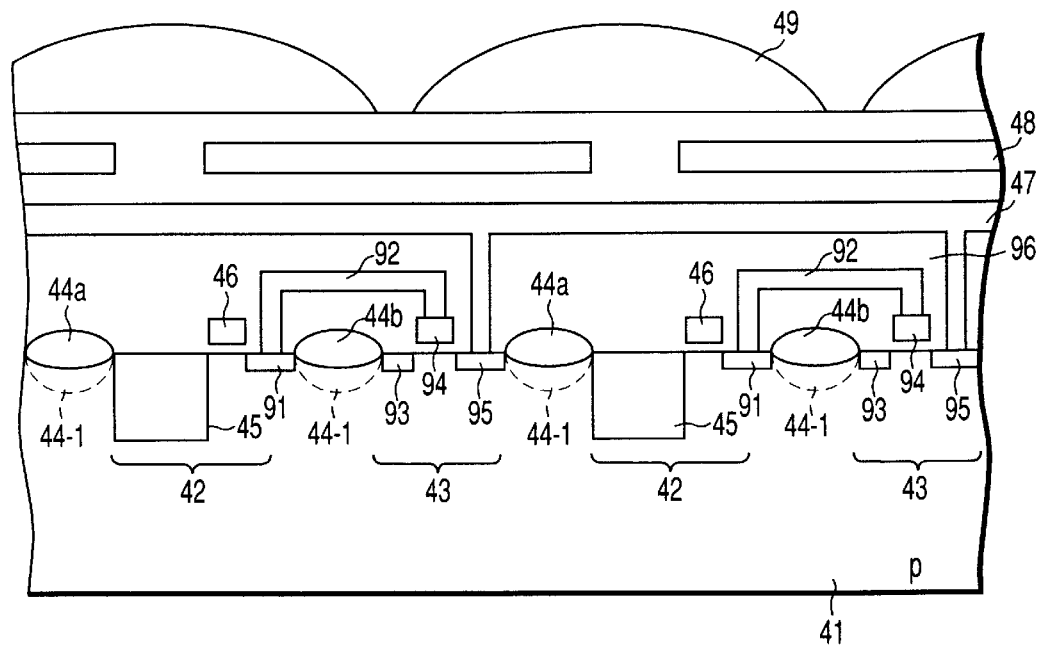
FIG. 4 is a schematic sectional view of a conventional MOS-type solid-state image sensor, showing a structure near photodiodes and amplification transistors.

FIG. 3 is a schematic sectional view of a MOS-type solid-state image sensor according to still another embodiment of the present invention, showing a structure near photodiodes and amplification transistors, within two pixel units.

The sensor shown in FIG. 3 is common to the sensor shown in FIGS. 1A and 1B in many respects. The sensor in FIG. 3 differs from the sensor in FIGS. 1A and 1B in that an element isolation region 37 has a trench isolation structure. More specifically, the element isolation region 37 is formed of a trench 38 formed in a substrate 21 and an insulator 39, e.g., a silicon oxide film, which is buried in the trench 38. The element isolation region 37 is formed in the same plan layout as that of the field oxide film 24a, 24b in FIGS. 1A and 1B. The bottom portion of the element isolation region 37 is positioned deeper than a depletion layer extending from an n-type diffusion layer 25 to a p-type substrate 21 in an equilibrium state where no voltage is applied.

In the sensor shown in FIG. 3 as well, charges generated in a deep portion of the semiconductor substrate 21 by long-wavelength light entering a deep layer of the substrate can be confined in one pixel unit to prevent leakage of the charges into adjacent pixel units. This can reduce color mixture and blooming which are caused by signals generated in a deep portion of the substrate and leaking from adjacent pixel units, and pose a problem in the prior art.

FIG. 6 is a perspective sectional view of a MOS-type solid-state image sensor according to still another embodiment of the present invention, showing a structure near photodiodes and reset transistors, within two pixel units.

As shown in FIG. 6, each pixel unit of this solid-state image sensor has heavily doped n-type semiconductor layers 52 and 53-1 formed on the upper surface of a lightly doped p-type semiconductor substrate 51 (or well). A gate electrode 55 is formed on the substrate 51 between the n-type semiconductor layers 52 and 53-1 through a gate insulating film 54 made of a silicon oxide film. The p-type substrate 51 and the n-type semiconductor layer 52 correspond to the p-type substrate 21 and the n-type diffusion layer 25 in FIGS. 1A and 1B, respectively.

The p-type semiconductor substrate 51 and the n-type semiconductor layer 52 constitute a photodiode for photoelectric conversion. This photodiode corresponds to the photodiode $1_{11}$ (or $1_{12}, 1_{13}, \ldots, 1_{33}, \ldots$) in FIG. 5. The p-type substrate 51, the n-type semiconductor layers 52 and 53-1, and the gate electrode 55 constitute a reset transistor. This reset transistor corresponds to the reset transistor $4_{11}$ (or $4_{12}, 4_{13}, \ldots, 4_{33}, \ldots$) in FIG. 5.

The n-type semiconductor layers 53-1 of the two pixel units are electrically connected to each other through a heavily or lightly doped n-type semiconductor layer 53-2 formed in the substrate 51. The bottom portion of the n-type semiconductor layer 53-1 is positioned deeper than the bottom portion of a depletion layer 56 extending from the n-type semiconductor layer 52 to the p-type semiconductor substrate 51 in an equilibrium state where no voltage is applied. The n-type semiconductor layer 53-2 is formed deeper than the depletion layer 56.

In the sensor shown in FIG. 6, the n-type semiconductor layer 53-1 serves as the drain of the reset transistor of each pixel unit. In the drains of the two adjacent pixel units, the distal end portions of the n-type semiconductor layers 53-1 reach deeper than the depletion layers 56 and are connected to each other through the n-type semiconductor layer 53-2 at a position deeper than the depletion layers 56. This structure is designed to allow the n-type semiconductor layers 53-1 and 53-2 to absorb diffusion currents 57 at deep positions and let them flow in the drains of the reset transistors.

As described above, the diffusion currents 57 increase as the carrier impurity concentration of the semiconductor substrate is decreased to expand the depletion layer of each photodiode so as to compensate for a decrease in photodetection output with a. decrease in pixel unit size. Even in this case, since most of the diffusion currents 57 flows first into the n-type semiconductor layers 53-1 and 53-2 located deeper than the depletion layers 56, the diffusion currents 57 do not flow into the depletion layers 56 so much.

Since the n-type semiconductor layers 53-1 and 53-2 constitute the drain of the reset transistor, the diffusion current 57 flows in the drain of the reset transistor. On the other hand, the diffusion current 57 flows into the photodiode constituted by the p-type substrate 51 and the n-type semiconductor layer 52 through the depletion layer 56 greatly decreases. This can increase the dynamic range of the solid-state image sensor.

If the n-type semiconductor layer 53-2 of the drain of the rest transistor is arranged but not buried in the semiconductor substrate 51, the transistor and the like formed on the upper surface of the semiconductor substrate may not properly operate. The n-type semiconductor layer 53-2 needs to be formed such that when the depletion layer 56 of the transistor formed in the upper surface of the substrate extends, the depletion layer 56 is not electrically connected to the n-type semiconductor layer 53-2.

If each reset transistor is formed by using a p-type MOS transistor, the same effects as described above can be obtained by forming p-type semiconductor layers as the semiconductor layers 53-1 and 53-2.

FIGS. 7A to 7E are perspective sectional views showing the steps in a method of manufacturing the sensor in FIG. 6.

A method of forming the drain of each reset transistor for absorbing diffusion currents, which is a characteristic feature of the embodiment, will be mainly described below.

First of all, the entire upper surface of the lightly doped p-type semiconductor substrate 51 is coated with a resist film. This resist film is patterned to form a resist pattern 71 having an opening formed only in a portion corresponding to the n-type semiconductor layers 53-1 and 53-2. The portion corresponding to the n-type semiconductor layers 53-1 and 53-2 is etched to form a trench 51a (FIG. 7A).

Subsequently, the resist pattern is removed by using an asher or the like. An n-type polysilicon film 72 is formed under a good coverage condition to fill the trench 51a and cover the entire surface of the substrate 51 (FIG. 7B). This film can be formed by a method of forming an amorphous silicon film first and then heating the film to form it into a polysilicon film.

The upper surface of the polysilicon film 72 is polished and planarized by CMP, etching, or the like (FIG. 7C). As a result, the trench 51a is filled with an n-type polysilicon layer 72a.

The entire upper surface of the substrate 51 is coated with a resist film. This resist film is patterned to form a resist pattern having an opening only in a portion corresponding to the n-type semiconductor layer 53-2 (FIG. 7D).

B (boron) ions are implanted into a portion, of the n-type polysilicon layer 72a, which is located above the portion corresponding to the n-type semiconductor layer 53-2 by using an accelerator to form a p-type layer 74. That is, a portion 74 near the upper surface of the substrate 51 is formed into a p-type portion by this ion implantation. After the ion implantation, the resist pattern is removed by using an asher or the like. As a result, the n-type semiconductor layer 53-2 is buried in the substrate 51 (FIG. 7E).

The gate insulating film 54 and the gate electrode 55 are then arranged at predetermined positions on the p-type substrate 51. As a result, the structure shown in FIG. 6 is completed.

The structure shown in FIG. 6 can be formed by another method described below.

First of all, the entire surface of the lightly doped p-type semiconductor substrate 51 is coated with a resist film. This resist film is patterned to form a resist pattern having an opening formed in only a portion corresponding to the n-type semiconductor layer 53-1.

P (phosphorus) ions are then implanted into the portion corresponding to the n-type semiconductor layer 53-1 by using an accelerator to form the n-type semiconductor layer. At this time, the phosphorus ions are preferably implanted at an energy of 160 keV or more and a dose of $5 \times 10^{13}$ cm$^{-3}$. After the ion implantation, the resist pattern is removed by using an asher or the like.

The entire upper surface of the substrate 51 is coated with a resist film. This resist film is patterned into a resist pattern having an opening formed only in a portion corresponding to the n-type semiconductor layer 53-2.

P (phosphorus) or arsenic ions are implanted into the portion corresponding to the n-type semiconductor layer 53-2 by using an accelerator to form the n-type semiconductor layer. At this time, phosphorus ions are preferably implanted at an energy of 400 keV or more and a dose of $5 \times 10^{13}$ cm$^{-3}$. After the ion implantation, the resist pattern is removed by using an asher or the like.

The gate insulating film 54 and the gate electrode 55 are arranged at predetermined positions on the p-type substrate 51. As a result, the structure shown in FIG. 6 is completed.

The n-type semiconductor layer 53-2 can be formed by the following method instead of the two methods described above. First of all, a trench is formed in the substrate 51. Polysilicon or the like is then buried in the trench. The upper surface of the resultant structure is planarized by CMP (Chemical Mechanical Polishing) or the like.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A solid-state image sensor comprising:

a plurality of pixel units arranged on a semiconductor substrate layer of a first conductivity type in a matrix format, each of said pixel units including a photoelectric conversion portion configured to convert photoelectrically image-sensing light and a signal extraction portion including a field-effect transistor for extracting a signal from said photoelectric conversion portion, said photoelectric conversion portion comprising a photodiode having a p-n junction formed between the substrate layer and a first diffusion layer that has a second conductivity type and is formed in the substrate layer;

a scanning circuit connected to the signal extraction portions and configured to read and transfer sequentially the signals obtained by the photoelectric portions of said plurality of pixel units, said scanning circuit including a plurality of signal wiring lines to transfer the signals from said pixel units; and element isolation regions configured to isolate said pixel units from each other, each pixel element isolation region having a bottom portion positioned deeper than a bottom portion of said first diffusion layer.

2. The sensor according to claim 1, wherein said element isolation region comprises an insulating oxide film formed on the substrate layer, and a second diffusion layer that is formed in the substrate layer immediately below the oxide film and having the first conductivity type and a carrier impurity concentration higher than that of the substrate layer.

3. The sensor according to claim 1, wherein said element isolation region comprises a trench formed in the substrate layer and an insulating layer buried in the trench.

4. The sensor according to claim 1, wherein each of said pixel units further comprises an extending layer of the second conductivity type formed in the substrate layer to laterally extend from the first diffusion layer to a position below the signal extraction portion.

5. The sensor according to claim 4, wherein each of said pixel units further comprises a partition layer formed in the substrate layer to laterally extend between the signal extraction portion and the extending layer in order to isolate the signal extraction portion from the extending layer.

6. The sensor according to claim 5, wherein the partition layer comprises a third diffusion layer formed in the substrate layer and having the first conductivity type and a carrier impurity concentration higher than that of the substrate layer.

7. The sensor according to claim 1, wherein each of said pixel units further comprises a reset transistor formed of a field-effect transistor configured to reset a signal charge in the photoelectric conversion portion.

8. The sensor according to claim 7, wherein the reset transistor comprises a drain layer of the second conductivity type formed in the substrate layer, and said drain layer includes a bottom portion positioned deeper than the bottom portion of said first diffusion layer.

9. The sensor according to claim 8, further comprising a connection layer of the second conductivity type formed in the substrate layer and configured to connect drain layers of the reset transistors corresponding to two of said pixel units, wherein said connection layer is situated deeper than the bottom portion of said first diffusion layer.

10. A solid-state image sensor comprising:
a plurality of pixel units arranged on a semiconductor substrate layer having a first conductivity type in a matrix format, each of said pixel units including a photodiode having a p-n junction formed between the substrate layer and a first diffusion layer which has a second conductivity type and is formed in the substrate layer and configured to convert photoelectrically image-sensing light, an amplification transistor comprising a MOS transistor configured to extract a signal obtained by the photodiode, a selection transistor comprising a MOS transistor configured to select said pixel unit, and a reset translator comprising a MOS transistor configured to reset a signal charge in the photodiode;
a scanning circuit configured to read and transfer sequentially the signals obtained by the photoelectric conversion portions of said plurality of pixel units, said scanning circuit including a plurality of signal wiring lines connected to the amplification transistors configured to transfer the signals from said pixel units, a plurality of address lines connected to the selection transistors configured to select said pixel units, a plurality of reset lines connected to the reset translators configured to selectively reset said pixel units, and a driving circuit configured to drive the signal wiring lines, the address lines, and the reset lines; and
element isolation regions configured to isolate said pixel units from each other, said element isolation region including a bottom portion positioned deeper than a bottom portion of said first diffusion layer.

11. The sensor according to claim 10, wherein said element isolation region comprises an insulating oxide film formed on the substrate layer, and a second diffusion layer that is formed in the substrate layer immediately below the oxide film and having the first conductivity type and a carrier impurity concentration higher than that of the substrate layer.

12. The sensor according to claim 10, wherein said element isolation region comprises a trench formed in the substrate layer and an insulating layer buried in the trench.

13. The sensor according to claim 2, wherein the bottom portion of said element isolation region is positioned deeper than a bottom portion of a depletion layer extending from the p-n junction to the substrate layer in an equilibrium state.

14. The sensor according to claim 3, wherein the bottom portion of said element isolation region is positioned deeper than a bottom portion of a depletion layer extending from the p-n junction to the substrate layer in an equilibrium state.

15. The sensor according to claim 9, wherein said connection layer and the bottom portion of said drain layer are positioned deeper than a bottom portion of a depletion layer extending from the p-n junction to the substrate layer in an equilibrium state.

16. The sensor according to claim 10, wherein the bottom portion of said element isolation region is positioned deeper than a bottom portion of a depletion layer extending from the p-n junction to the substrate layer in an equilibrium state.

17. A solid-state image sensor comprising:
a plurality of pixel units arranged on a semiconductor substrate layer of a first conductivity type in a matrix format, each of said pixel units including a photoelectric conversion portion configured to convert photoelectrically image-sensing light and a signal extraction portion including a field-effect transistor configured to extract a signal from said photoelectric conversion portion, said photoelectric conversion portion comprising a photodiode including a p-n junction formed between the substrate layer and a first diffusion layer that has a second conductivity type and is formed in the substrate layer;
a scanning circuit connected to the signal extraction portions and configured to read and transfer sequentially the signals obtained by the photoelectric portions of said plurality of pixel units; and
element isolation regions configured to isolate said pixel units from each other, each pixel element isolation region including a bottom portion positioned deeper than a bottom portion of said first diffusion layer,
wherein said element isolation region comprises an insulating oxide film formed on the substrate layer, and a second diffusion layer that is formed in the substrate layer immediately below the oxide film and has the first conductivity type and a carrier impurity concentration higher than that of the substrate layer.

18. The sensor according to claim 17, wherein each of said pixel units further comprises a reset transistor formed of a field-effect transistor configured to reset a signal charge in the photoelectric conversion portion.

19. The sensor according to claim 18, wherein the reset transistor comprises a drain layer of the second conductivity type formed in the substrate layer, and said drain layer has a bottom portion positioned deeper than the bottom portion of said first diffusion layer.

20. The sensor according to claim 19, further comprising a connection layer of the second conductivity type formed in the substrate layer and configured to connect drain layers of the reset transistors corresponding to two of said pixel units, wherein said connection layer is situated deeper than the bottom portion of said first diffusion layer.

21. A solid-state image sensor comprising:
a plurality of pixel units arranged on a semiconductor substrate layer of a first conductivity type in a matrix format, each of said pixel units including a photoelectric conversion portion configured to convert photoelectrically image-sensing light and a signal extraction portion including a field-effect transistor configured to extract a signal from said photoelectric conversion portion, said photoelectric conversion portion comprising a photodiode including a p-n junction formed between the substrate layer and a first diffusion layer that has a second conductivity type and is formed in the substrate layer;

a scanning circuit connected to the signal extraction portions and configured to read and transfer sequentially the signals obtained by the photoelectric portions of said plurality of pixel units; and element isolation regions configured to isolate said pixel units from each other, each pixel element isolation region including a bottom portion positioned deeper than a bottom portion of said first diffusion layer, wherein said element isolation region comprises a trench formed in the substrate layer and an insulating layer buried in the trench.

22. The sensor according to claim 21, wherein each of said pixel units further comprises a reset transistor formed of a field-effect transistor for resetting a signal charge in the photoelectric conversion portion.

23. The sensor according to claim 22, wherein the reset transistor comprises a drain layer of the second conductivity type formed in the substrate layer, and said drain layer has a bottom portion positioned deeper than the bottom portion of said first diffusion layer.

24. The sensor according to claim 23, further comprising a connection layer of the second conductivity type formed in the substrate layer and configured to connect drain layers of the reset transistors corresponding to two of said pixel units, wherein said connection layer is situated deeper than the bottom portion of said first diffusion layer.

* * * * *